US006818916B2

(12) United States Patent
Kano

(10) Patent No.: US 6,818,916 B2
(45) Date of Patent: Nov. 16, 2004

(54) LIGHT-RECEIVING DEVICE WITH QUANTUM-WAVE INTERFERENCE LAYERS

(75) Inventor: Hiroyuki Kano, Aichi-ken (JP)

(73) Assignee: Canare Electric Co., Ltd., Aichi-gun (JP)

( * ) Notice: Subject to any disclaimer, the term of this patent is extended or adjusted under 35 U.S.C. 154(b) by 0 days.

(21) Appl. No.: 09/461,756

(22) Filed: Dec. 16, 1999

(65) Prior Publication Data

US 2003/0032208 A1 Feb. 13, 2003

(30) Foreign Application Priority Data

Dec. 17, 1998 (JP) .......................................... 10-358935

(51) Int. Cl.$^7$ .............................................. H01L 31/00
(52) U.S. Cl. ............................. 257/21; 257/12; 257/14; 257/15; 257/17; 257/458; 257/461; 257/464
(58) Field of Search ................................ 257/9, 12, 14, 257/15, 17, 21, 22, 186, 199, 431, 438, 458, 461, 464, 481

(56) References Cited

U.S. PATENT DOCUMENTS

| 5,198,682 | A | | 3/1993 | Wu et al. |
| 5,311,009 | A | * | 5/1994 | Capasso et al. ............. 250/214 |
| 5,391,893 | A | * | 2/1995 | Yamazaki ..................... 257/52 |
| 5,471,068 | A | * | 11/1995 | Tsuji et al. .................... 257/21 |
| 5,737,350 | A | * | 4/1998 | Motoda et al. ................ 372/45 |
| 6,130,466 | A | * | 10/2000 | Schneider et al. .......... 257/440 |
| 6,175,123 | B1 | | 1/2001 | Kano |

FOREIGN PATENT DOCUMENTS

| EP | 0 874 403 A2 | 10/1998 |
| WO | WO 94/00884 | 1/1994 |

OTHER PUBLICATIONS

Sze, "Physics of Semiconductor Devices," 1981, John Wiley & Sons, Inc., pp. 743–760.*
Takagi et al., "Design of Multi–Quantum Barrier (MQB) and Experimental Verification of MQB Effect," Tokyo Institute of Technology, OQE91–13, p. 73–78 (1991).*
U.S. patent application Ser. No. 09/915,384, filed Jul. 22, pending.
U.S. patent application Ser. No. 09/057,549, filed Apr. 9, pending.
U.S. patent application Ser. No. 09/064,222, filed Apr. 22, pending.
U.S. patent application Ser. No. 09/059,374, filed Apr. 14, pending.
U.S. patent application Ser. No. 09/245,299, filed Feb. 5, pending.
U.S. patent application Ser. No. 09/296,743, filed Apr. 23, pending.

(List continued on next page.)

Primary Examiner—Bradley Baumeister
(74) Attorney, Agent, or Firm—Oblon, Spivak, McClelland, Maier & Neustadt, P.C.

(57) ABSTRACT

A light-receiving device of a pin junction structure, constituted by a quantum-wave interference layers $Q_1$ to $Q_4$ with plural periods of a pair of a first layer W and a second layer B and carrier accumulation layers $C_1$ to $C_3$. The second layer B has wider band gap than the first layer W. Each thicknesses of the first layer W and the second layer B is determined by multiplying by an even number one fourth of wavelength of quantum-wave of carriers in each of the first layer W and the second layer B existing at the level near the lowest energy level of the second layer B. A δ layer, for sharply varying energy band, is formed at an every interface between the first layer W and the second layer B and has a thickness substantially thinner than the first layer W and the second layer B. As a result, when electrons are excited in the carrier accumulation layers $C_1$ to $C_3$, electrons are propagated through the quantum-wave interference layer from the n-layer to the p-layer as a wave, and electric current flows rapidly.

11 Claims, 10 Drawing Sheets

OTHER PUBLICATIONS

U.S. patent application Ser. No. 09/300,389, filed Apr. 27, pending.
U.S. patent application Ser. No. 09/320,510, filed May 26, pending.
U.S. patent application Ser. No. 09/421,221, filed Oct. 20, pending.
U.S. patent application Ser. No. 09/422,078, filed Oct. 21, pending.
U.S. patent application Ser. No. 09/425,737, filed Oct. 22, pending.
U.S. patent application Ser. No. 09/425,735, filed Oct. 22, pending.
U.S. patent application Ser. No. 09/425,685, filed Oct. 22, pending.
U.S. patent application Ser. No. 09/461,331, filed Dec. 15, pending.
U.S. patent application Ser. No. 09/636,081, filed Aug. 11, pending.
U.S. patent application Ser. No. 09/645,931, filed Aug. 25, pending.
U.S. patent application Ser. No. 09/648,367, filed Aug. 25, pending.
U.S. patent application Ser. No. 09/645,932, filed Aug. 25, pending.
U.S. patent application Ser. No. 09/669,855, filed Sep. 27, pending.
U.S. patent application Ser. No. 09/461,756, filed Dec. 16, pending.
U.S. patent application Ser. No. 09/688,201, filed Oct. 16, pending.
U.S. patent application Ser. No. 09/695,312, filed Oct. 16, pending.

* cited by examiner

FIG. 4A
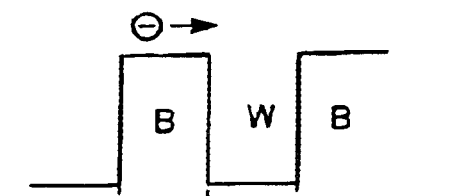
FIG. 4B
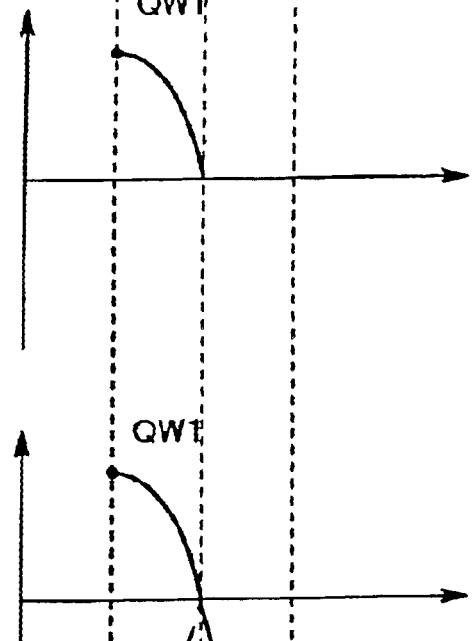
FIG. 4C
FIG. 4D

LIGHT-RECEIVING DEVICE WITH QUANTUM-WAVE INTERFERENCE LAYERS

BACKGROUND OF THE INVENTION

1. Field of the Invention

The present invention relates to an opto-electric conversion device with a new structure, or a light-receiving device.

2. Description of the Related Art

A light-receiving device has been known to have a pin junction structure. A backward voltage is applied to the pin layers of the device, and electron-hole pairs are generated by that light incided from the side of a p-layer is absorbed in an i-layer. The electron-hole pairs excited in the i-layer are accelerated by a backward voltage in the i-layer, and electrons and holes are flowing into an n-layer and a p-layer, respectively. Thus a photocurrent whose intensity varies according to an intensity of the incident light is outputted.

To improve an opto-electric conversion effectivity, the i-layer which absorbs light is formed to have a comparatively larger thickness. But when the thickness of the i-layer becomes thicker, more times are needed to draw carriers to the n-layer and the p-layer. As a result, the response velocity of the opto-electric conversion is lowered. To improve the velocity, an electric field in the i-layer is increased by increasing a backward voltage. But when the backward voltage is enlarged, an element separation become difficult and a leakage current is occurred. As a result, an photocurrent which flows when the device is not incided by light, or a dark current, is increased.

Thus conventional light-receiving devices had an interrelation among a light-receiving sensitivity, a detecting velocity, and a noise current, which restricts their performances.

SUMMARY OF THE INVENTION

It is, therefore, an object of the present invention to improve the light-receiving sensitivity and the response velocity of the opto-electric conversion by providing a light-receiving device having a pin junction of a completely new structure.

In light of these objects a first aspect of the present invention is a light-receiving device, which converts incident light into electric current, constituted by a quantum-wave interference layer units having plural periods of a pair of a first layer and a second layer, the second layer having a wider band gap than the first layer, and a carrier accumulation layer disposed between adjacent two of the quantum-wave interference layer units. Each thickness of the first and the second layers is determined by multiplying by an even number one fourth of a quantum-wave wavelength of carriers in each of the first and the second layers, and the carrier accumulation layer has a band gap narrower than that of said second layer. Plural units of the quantum-wave interference layers are formed with a carrier accumulation layer, which has a band gap narrower than that of the second layer, lying between each of the quantum-wave interference units.

The second aspect of the present invention is to set a kinetic energy of the carriers, which determines the quantum-wave wavelength, at the level near the bottom of a conduction band when the carriers are electrons or at the level near the bottom of a valence band in the second layer when the carriers are holes.

The third aspect of the present invention is to define each thickness of the first and the second layers as follows:

$$D_W = n_W \lambda_W/4 = n_W h/4[2m_W(E+V)]^{1/2} \quad (1)$$

and $$D_B = n_B \lambda_B/4 = n_B h/4(2m_B E)^{1/2} \quad (2)$$

In Eqs. 1 and 2, h, $m_W$, $m_B$, E, V, and $n_W$, $n_B$ represent Plank's constant, the effective mass of carrier conducting in the first layer, the effective mass of carriers in the second layer, the kinetic energy of the carriers at the level near the lowest energy level of the second layer, the potential energy of the second layer relative to the first layer, and even numbers, respectively.

The fourth aspect of the present invention is a quantum-wave interference layer having a partial quantum-wave interference layers $I_k$ with arbitrary periods $T_k$ including a first layer having a thickness of $n_{Wk}\lambda_{Wk}/4$ and a second layer having a thickness of $n_{Bk}\lambda_{Bk}/4$ for each of a plural different values $E_k$, $E_k+V$. $E_k$, $E_k+V$, $\lambda_{Bk}$, $\lambda_{Wk}$, and $n_{Bk}$, $n_{Wk}$ represent a kinetic energy of carriers conducted in the second layer, a kinetic energy of carriers conducted in the first layer, a quantum-wave wavelength corresponding energies of the second layer and the first layer, and even numbers, respectively.

The fifth aspect of the present invention is to form a carrier accumulation layer having the same bandwidth as that of the first layer.

The sixth aspect of the present invention is to form a carrier accumulation layer having a thickness same as its quantum-wave wavelength $\lambda_W$.

The seventh aspect of the present invention is to form a δ layer between the first layer and the second layer, which sharply varies band gap energy at the boundary between the first and second layers and is substantially thinner than that of the first and the second layers.

The eighth aspect of the present invention is a light-receiving device having a pin junction structure, and the quantum-wave interference layer and the carrier accumulation layer are formed in the i-layer.

The ninth aspect of the present invention is to form the quantum-wave interference layer and the carrier accumulation layer in the n-layer or the p-layer.

The tenth aspect of the present invention is a light-receiving device having a pin junction structure.

First to Third, and Eighth to Tenth Aspects of the Invention

The principle of the light-receiving device of the present invention is explained hereinafter. FIG. 1 shows an energy diagram of a conduction band and a valence band when an external voltage is applied to the interval between the p-layer and the n-layer in a forward direction. As shown in FIG. 1, the conduction band of the i-layer becomes plane by applying the external voltage. Four quantum-wave interference layer units $Q_1$ to $Q_4$ are formed in the i-layer, and carrier accumulation layers $C_1$ to $C_3$ are formed at each intervals of the quantum-wave interference layer units. FIG. 2 shows a conduction band of a quantum-wave interference layer unit $Q_1$ having a multi-layer structure with plural periods of a first layer W and a second layer B as a unit. A band gap of the second layer B is wider than that of the first layer W.

Electrons conduct from left to right as shown by an arrow in FIG. 2. Among the electrons, those that exist at the level near the lowest energy level of a conduction band in the second layer B are most likely to contribute to conduction. The electrons near the bottom of conduction band of the second layer B has a kinetic energy E. Accordingly, the electrons in the first layer W have a kinetic energy E+V which is accelerated by potential energy V due to the band gap between the first layer W and the second layer B. In other words, electrons that move from the first layer W to the second layer B are decelerated by potential energy V and return to the original kinetic energy E in the second layer B. As explained above, kinetic energy of electrons in the conduction band is modulated by potential energy due to the multi-layer structure.

When thicknesses of the first layer W and the second layer B are equal to order of quantum-wave wavelength, electrons tend to have characteristics of a wave. The wave length of the electron quantum-wave is calculated by Eqs. 1 and 2 using kinetic energy of the electron. Further, defining the respective wave number vector of first layer W and second layer B as $K_W$ and $K_B$, reflectivity R of the wave is calculated by:

$$R = (|K_W| - |K_B|)/(|K_W| + |K_B|)$$
$$= ([m_W(E+V)]^{1/2} - [m_BE]^{1/2})/([m_W(E+V)]^{1/2} + [m_BE]^{1/2})$$
$$= [1 - (m_BE/m_W(E+V))^{1/2}]/[1 + (m_BE/m_W(E+V))^{1/2}]$$
(3)

Further, when $m_B = m_W$, the reflectivity R is calculated by:

$$R = [1 - (E/(E+V))^{1/2}]/[1 + (E/(E+V))^{1/2}]$$
(4).

When $E/(E+V) = x$, Eq. 4 is transformed into:

$$R = (1 - x^{1/2})/(1 + x^{1/2})$$
(5).

The characteristic of the reflectivity R with respect to the energy ratio x obtained by Eq. 5 is shown in FIG. 3.

When the condition $x \leq 1/10$ is satisfied, $R \geq 0.52$. Accordingly, the relation between E and V is satisfied with:

$$E \leq V/9$$
(6).

Since the kinetic energy E of the conducting electrons in the second layer B exists near the bottom of the conduction band, the relation of Eq. 6 is satisfied and the reflectivity R at the interface between the second layer B and the first layer W becomes 52% or more. Consequently, the multi-layer structure having two kinds of layers with band gaps different from each other enables to reflect quantum-wave of electrons which is injected to an i-layer.

Further, utilizing the energy ratio x enables the thickness ratio $D_B/D_W$ of the second layer B to the first layer W to be obtained by:

$$D_B/D_W = [m_W/(m_Bx)]^{1/2}$$
(7).

When thicknesses of the first and second layers are determined by multiplying an even number by one fourth of a quantum-wave wavelength, or by a half of a quantum-wave wavelength, for example, a standing wave rises in a quantum-wave interference layer, and a resonant conduction is occurred. That is, when a quantum-wave period of the standing wave and a potential period of the quantum-wave interference layer is corresponded to each other, a scattering of the carrier in each layer is suppressed, and a conduction of a high mobility is realized.

When light is incided to the i-layer formed in the light-receiving device, electrons excited in conduction bands of the carrier accumulation layers $C_1$, $C_2$ and $C_3$ are accumulated therein. The excited electrons tend to flow to the p-layer by the applied forward voltage. But the energy which the excited electrode have is lower than the bottom of the conduction band in the second layer B. Accordingly, the electrons do not flow because a transmission condition is not satisfied for electrons in the quantum-wave interference layer unit which exists at the side toward the p-layer.

But when the electrons existing in the carrier accumulation layers $C_1$, $C_2$ and $C_3$ are increased, electrons tend to exist in higher level. Then a kinetic energy of the electrons existing in higher level increases, and the electrons can highly conduct or transmit in the quantum-wave interference layer units because of satisfaction of the transmission condition. As a result, the electrons passes the quantum-wave interference layer units $Q_2$, $Q_3$, and $Q_4$ and flow toward the p-layer, which occurs a photocurrent.

Because a forward voltage is applied to the light-receiving device, driving at a low voltage becomes possible and an element separation become easier. When light is not incided, electrons does not have a high transmittivity in the quantum-wave interference layer units. As a result, a dark current can be lowered. The present inventor thinks that electrons is conducted in the quantum-wave interference layer units as a wave. Accordingly, a response velocity is considered to become larger.

Thicknesses of the first layer W and the second layer B are determined for selectively transmitting one of holes and electrons, because of a difference in potential energy V between the valence and the conduction bands, and a difference in effective mass of holes and electrons in the first layer W and the second layer B. Namely, the optimum thickness of the first and the second layers for transmitting electrons is not optimum for transmitting holes. Eqs. 5–9 refer to a structure of the quantum-wave interference layer for transmitting electrons selectively. The thickness for selectively transmitting electrons is designed based on the potential difference in the conduction band and effective mass of electrons. Consequently, the quantum-wave interference layer has a high transmittivity (or a high mobility) for electrons, but not for holes.

Further, the thickness for selectively transmitting holes is designed based on a difference in potential energy of the valence band and effective mass of holes, realizing another type of quantum-wave interference layer as a hole transmission layer, which has a high mobility for holes and which has an ordinary mobility for electrons.

Further explanation can be obtained by FIGS. 4A–4H. FIGS. 4A–4H illustrate the relationship between quantum-wave reflection of electrons in a potential of quantum-well structure and a period of potential representing a conduction band of a multi quantum-well (MQW). FIGS. 4A–4D show the relationship when the period, i.e., width of the second layer B or the first layer W, of the potential is equal to an odd number multiplied by one fourth of the wavelength of propagated electron. This type of the potential is named as $\lambda/4$ type potential hereinafter. FIGS. 4E–4H show when the period of the potential is equal to a natural number multiplied by a half of the wavelength of propagated electron. This type of the potential is named as $\lambda/2$ type potential hereinafter. In order to make it visually intelligible, thickness of each layers is unified in FIGS. 4A–4H. Electrons existing around the bottom of the second layer B conduct from left to right as shown by an arrow in FIGS. 4A and 4E. And in FIGS. 4B and 4F, the electrons reach the interface between the first layer W and the second layer B.

When the quantum-wave of the electrons reaches the interface between the second layer B and the first layer W in the $\lambda/4$ type potential, a transmission wave QW2 and a reflection wave QW3 having a phase equal to that of the transmission wave QW2, are generated with respect to an incident wave QW1 as shown in FIG. 4C. Then when the transmission wave QW2 reaches the interface between the first layer W and the second layer B, a transmission wave QW4 and a reflection wave QW5 having a phase opposite to that of the transmission wave QW4 are generated as shown in FIG. 4D. The relationship between phases of the transmission wave and the reflection wave at the interface depends on following or rising of a potential of the conduction band at the interface. In order to make it visually intelligible, each amplitudes of QW1, QW2, QW3, QW4, and QW5 is unified in FIGS. 4A–4H.

With respect to the λ/4 type potential of the multi quantum-well, the propagating quantum-wave of electrons represented by QW1, QW2 and QW4 and the reflecting quantum-wave of electrons represented by QW3 and QW5 cancels with each other, as shown in FIG. 4D. The quantum-wave of electrons represented by the QW1, QW2 and QW4 propagates from left to right, and the quantum-wave of electrons represented by the QW3 and QW5, generated by the reflection at two interfaces, propagates from right to left. Accordingly, a multi quantum-well, having a potential which is formed in a period, i.e., the width of the first layer W and the second layer B, determined by multiplying by an odd number one fourth of quantum-wave wavelength of propagated electrons, cancels the quantum-wave of electrons. In short, the multi quantum-well functions as a reflection layer which does not propagate electrons.

With respect to a multi quantum-well, having a potential which is formed in a period, i.e., the width of the first layer W and the second layer B, determined by multiplying by an even number one fourth of quantum-wave wavelength of propagated electrons, i.e., λ/2 type potential, as shown in FIGS. 4E–4H, the quantum-wave of electrons can become a standing wave.

Similarly, when a quantum-wave of electrons reaches the interface between the second layer B and the first layer W in the λ/2 type potential, a transmission wave QW2 and a reflection wave QW3 having a phase corresponding to that of the transmission wave QW2, are generated with respect to an incident wave QW1 as shown in FIG. 4G. Then when the transmission wave QW2 reaches the interface between the first layer W and the second layer B, a transmission wave QW4 and a reflection wave QW5 having a phase opposite to that of the transmission wave QW4 are generated as shown in FIG. 4H. With respect to λ/2 type potential of the multi quantum-well, the propagating quantum-wave of electrons represented by QW1, QW2 and QW4 and the reflecting quantum-wave of electrons represented by QW5 intensifies to each other, as shown in FIG. 4H. On the other hand, the reflection waves QW3 and QW5 can be considered to cancel with each other and the quantum-wave of electrons which is propagated from left to right in FIG. 4E can be a standing wave. Accordingly, with respect to the multi quantum-well, having a potential which is formed in a period, i.e., the width of the first layer W and the second layer B, determined by multiplying by an even number one fourth of quantum-wave wavelength of propagated electrons, the quantum-wave of electrons can become a standing wave and a transmission layer having a high transmittivity (or a high mobility) for electrons can be realized.

Alternatively, a multi quantum-well, having a potential which is formed in a period determined by multiplying by a natural number half of quantum-wave wavelength of holes, can be applied to the relationship described above.

The quantum-wave interference layer unit described above can transmit carriers in accordance with numbers of electrons accumulated in the carrier accumulation layer. Accordingly, the light-receiving device can be formed by only one of the n-layer and the p-layer in which the quantum-wave interference layer units and the carrier accumulation layer are formed. Alternatively, the light-receiving device can be formed by a pn junction structure, in which the quantum-wave interference layer units and the carrier accumulation layer are formed in at least one of n-layer and p-layer.

Fourth Aspect of the Present Invention

FIG. 5 shows a plurality quantum-wave interference units $I_k$ with arbitrary periods $T_k$ including a first layer having a thickness of $D_{Wk}$ and a second layer having a thickness of $D_{Bk}$ and arranged in series.

Each thickness of the first and the second layers satisfies the formulas:

$$D_{Wk}=n_{Wk}\lambda_{Wk}/4=n_{Wk}h/4[2m_{Wk}(E_k+V)]^{1/2} \quad (8)$$

and $$D_{Bk}=n_{Bk}\lambda_{Bk}/4=n_{Bk}h/4(2m_{Bk}E_k)^{1/2} \quad (9)$$

In Eqs. 8 and 9, $E_k$, $m_{Wk}$, $m_{Bk}$, and $n_{Wk}$ and $n_{Bk}$ represent plural kinetic energy levels of carriers conducted into the second layer, effective mass of carriers with kinetic energy $E_k+V$ in the first layer, effective mass of carriers with kinetic energy $E_k$ in the second layer, and arbitrary even numbers, respectively.

The plurality of the partial quantum-wave interference layers $I_k$ are arranged in series from $I_1$ to $I_j$, where j is a maximum number of k required to form a quantum-wave interference layer as a whole. The carriers existing in a certain consecutive energy range can be effectively transmitted by narrowing a discrete intervals.

Fifth and Sixth Aspects of the Present Invention

The fifth aspect of the present invention is to form the band width of the carrier accumulation layer to have the same bandwidth as that of the first layer. And the sixth aspect of the present invention is to form the carrier accumulation layer to have a thickness same as its quantum-wave wavelength $\lambda_W$. As a result, the carriers excited in the carrier accumulation layer can be confined effectively.

Seventh Aspect of the Present Invention

The seventh aspect of the present invention is directed forming a δ layer at the interface between the first layer W and the second layer B. The δ layer has a relatively thinner thickness than both of the first layer W and the second layer B and sharply varies an energy band. By sharply varying the band gap of the interfaces, the potential energy V of an energy band becomes larger substantially and the value x of Eq. 5 becomes smaller, as shown in FIGS. 7A–7D. Without forming a δ layer as shown in FIG. 7A, a part of component of the first layer W and the second layer B mixes when the second layer B is laminated on the first layer W, and an energy band gap which varies sharply cannot be obtained, as shown in FIG. 7B. When a δ layer is formed at each interfaces of the first and the second layers, as shown in FIG. 7C, even if a part of component of the first layer W and the second layer B mixes, an energy band gap varies sharply compared with the case without δ layers, as shown in FIG. 7D.

Variations are shown in FIGS. 6A to 6D. The δ layer may be formed on both ends of the every first layer W as shown in FIGS. 6A to 6D. In FIG. 6A, the δ layers are formed so that an energy level higher than that of the second layer B may be formed. In FIG. 6B, the δ layers are formed so that a band having lower bottom than that of the first layer W may be formed. In FIG. 6C, the δ layers are formed so that the energy level higher than that of the second layer B and the energy level lower than that of the first layer W may be formed. As an alternative to each of the variations shown in FIGS. 6A to 6C, the δ layer can be formed on one end of the every first layer W as shown in FIG. 6D.

BRIEF DESCRIPTION OF THE DRAWINGS

Other objects, features, and characteristics of the present invention will become apparent upon consideration of the following description and the appended claims with reference to the accompanying drawings, all of which form a part of the specification, and wherein reference numerals designate corresponding parts in the various figures, wherein:

FIGS. 4A–4H are views of a relationship between quantum-wave reflection and transmission of electrons in a potential of quantum-well structure and a period of potential representing a conduction band of a multi quantum-well (MQW);

DETAILED DESCRIPTION OF THE PREFERRED EMBODIMENTS

The invention will be more fully understood by reference to the following examples.

EXAMPLE 1

Figure 8:
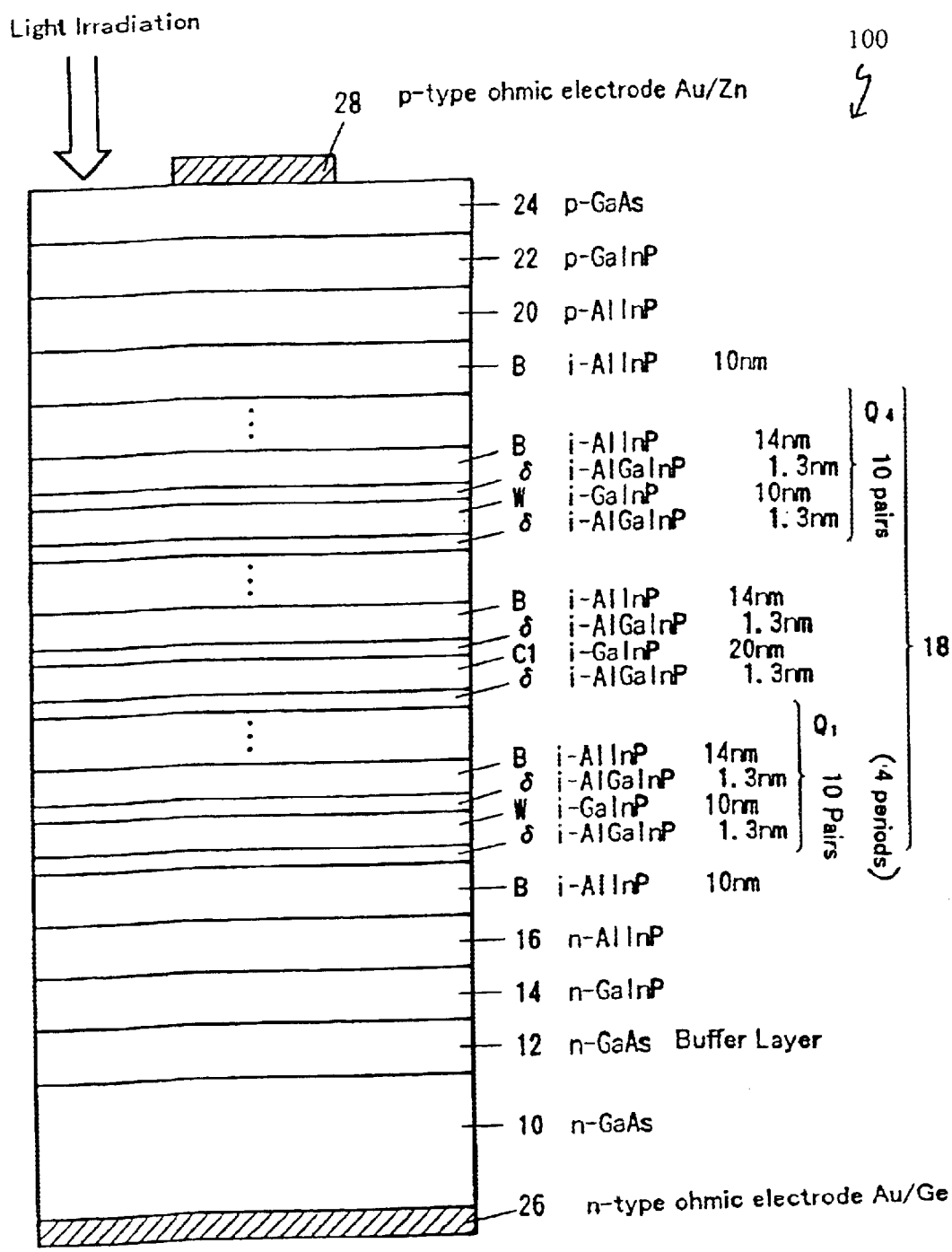
FIG. 8 is a sectional view showing a structure of a light-receiving device 100 (Example 1)

FIG. 8 is a sectional view of a semiconductor device 100 having an pin junction structure in which a quantum-wave interference layer is formed in an i-layer. The light-receiving device 100 has a substrate 10 made of gallium arsenide (GaAs). A GaAs buffer layer 12 of n-type conduction, having a thickness generally of 0.3 μm and an electron concentration of $2 \times 10^{18}/cm^3$, is formed on the substrate 10. An n-$Ga_{0.51}In_{0.49}P$ contact layer 14 of n-type conduction, having a thickness generally of 0.13 μm and electron concentration of $2 \times 10^{18}/cm^3$, is formed on the buffer layer 12. An n-$Al_{0.51}In_{0.49}P$ n-layer 16 of n-type conduction, having a thickness generally of 0.43 μm and an electron concentration of $1 \times 10^{18}/cm^3$, is formed on the contact layer 14. A non-doped i-layer 18 is formed on the n-layer 16. A $Al_{0.51}In_{0.49}P$ p-layer 20 of p-type conduction, having a thickness generally of 0.43 μm and a hole concentration of $1 \times 10^{18}/cm^3$, is formed on the i-layer 18. A p-$Ga_{0.51}In_{0.49}P$ second contact layer 22 of p-type conduction, having a thickness generally of 0.13 μm and a hole concentration of $2 \times 10^{18}/cm^3$, is formed on the p-layer 20. A p-GaAs first contact layer 24 of p-type conduction, having a thickness generally of 0.06 μm and a hole concentration of $2 \times 10^{18}/cm^3$, is formed on the second contact layer 22. An electrode layer 26 made of gold and germanium (Au/Ge), having a thickness generally of 0.2 μm, is formed so as to cover the entire back of the substrate 10. Another electrode layer 28 made of Au/Zn, having a thickness generally of 0.2 μm, is formed on some portion of the first contact layer 24.

Figure 6A:
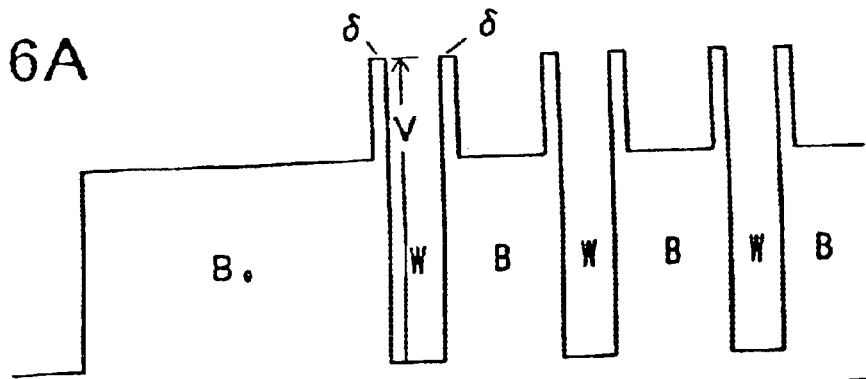
FIGS. 6A–6D are explanatory views of δ layers according to the present invention.
Figure 6B:
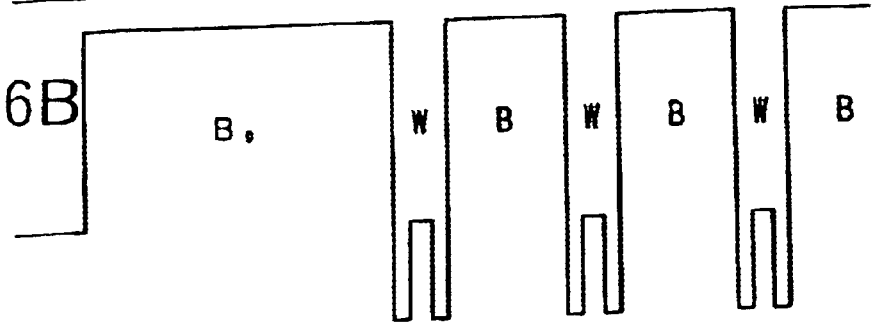
Figure 6C:
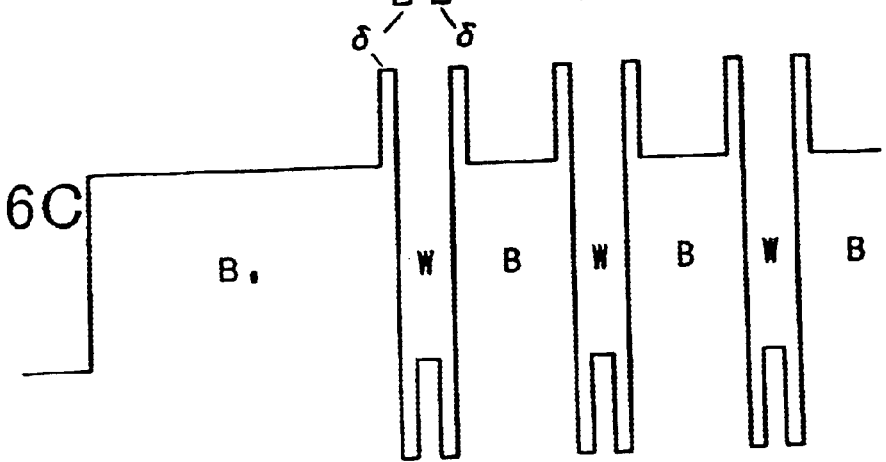
Figure 6D:
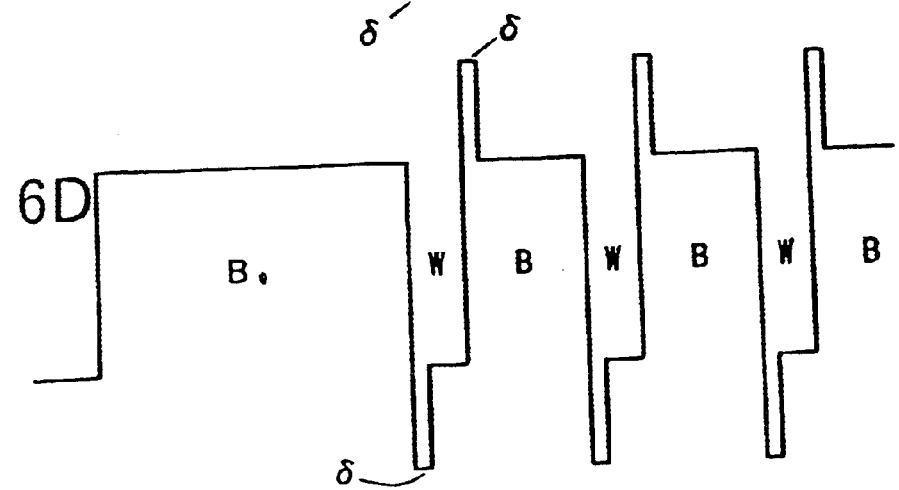
Figure 7A:
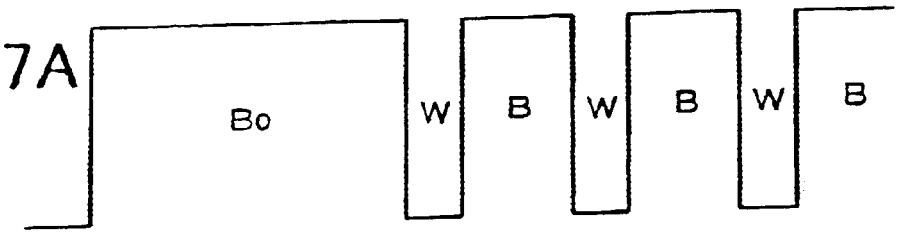
FIGS. 7A–7D are views showing energy level according to the second and eighth aspects of the present invention.
Figure 7B:
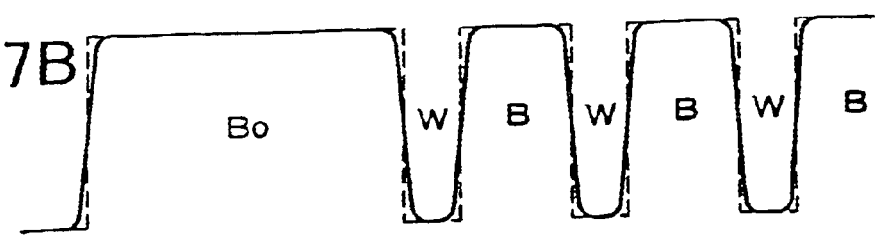
Figure 7C:
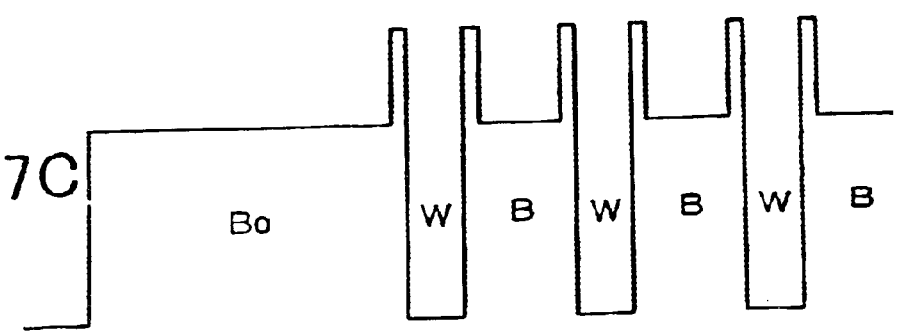
Figure 7D:
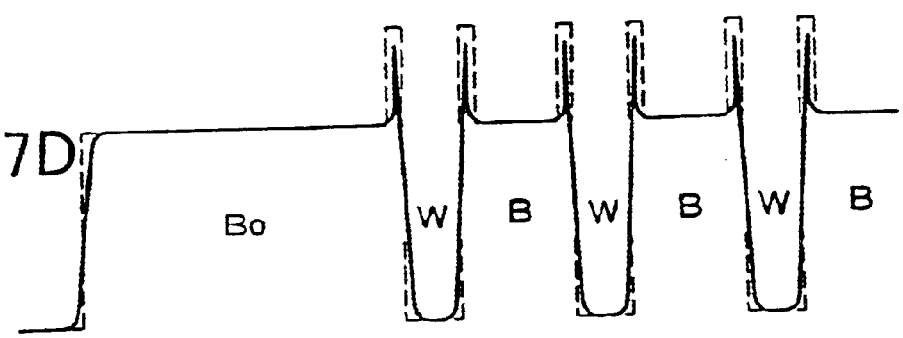

A quantum-wave interference unit $Q_1$ having a multi-quantum layer structure with 10 pairs of a $Ga_{0.51}In_{0.49}P$ first layer W, having a thickness of 10 nm, a $Al_{0.51}In_{0.49}P$ second layer B, having a thickness of 14 nm, and a non-doped $Al_{0.33}Ga_{0.33}In_{0.33}P$ δ layer, having a thickness of 1.3 nm, disposed between the first layer W and the second layer B is formed in the i-layer 18. $Q_2, \ldots Q_4$ are formed like $Q_1$, and 4 quantum-wave interference units in total are formed in the i-layer 18. FIG. 6A shows a band structure of the quantum-wave interference layer $Q_1$ in detail. A non-doped $Ga_{0.51}In_{0.49}P$ carrier accumulation layer $C_i$, having a thickness of 20 nm, is formed between any quantum-wave interference units $Q_i$ and $Q_{i+1}$, respectively. Thicknesses of the first layer W and the second layer are determined according to Eqs. 1 and 2, respectively, on condition that no external voltage is applied.

The second layers B which contact to the p-layer 20 and the n-layer 16 have thickness of 10 nm, respectively. And the substrate 10 has a diameter of 2.0 inches and the normal direction of its main surface is offset toward the [011] axis by 15 degree from the (100) plane.

The light-receiving device 100 was manufactured by gas source molecular beam epitaxial deposition (GS-MBE) which is an epitaxial growth method under extremely high vacuum condition. GS-MBE is different from a conventional MBE which supplies group III and V elements both from solid state sources. In GS-MBE, group III elements such as indium (In), gallium (Ga), and aluminum (Al) are supplied from a solid source and group V elements such as arsenic (As) and phosphorous (P) are supplied by heat decomposition of gas material such as $ASH_3$ and $PH_3$. Alternatively, the light-receiving device 100 can be manufactured by metal organic chemical vapor deposition (MOCVD).

Figure 1:
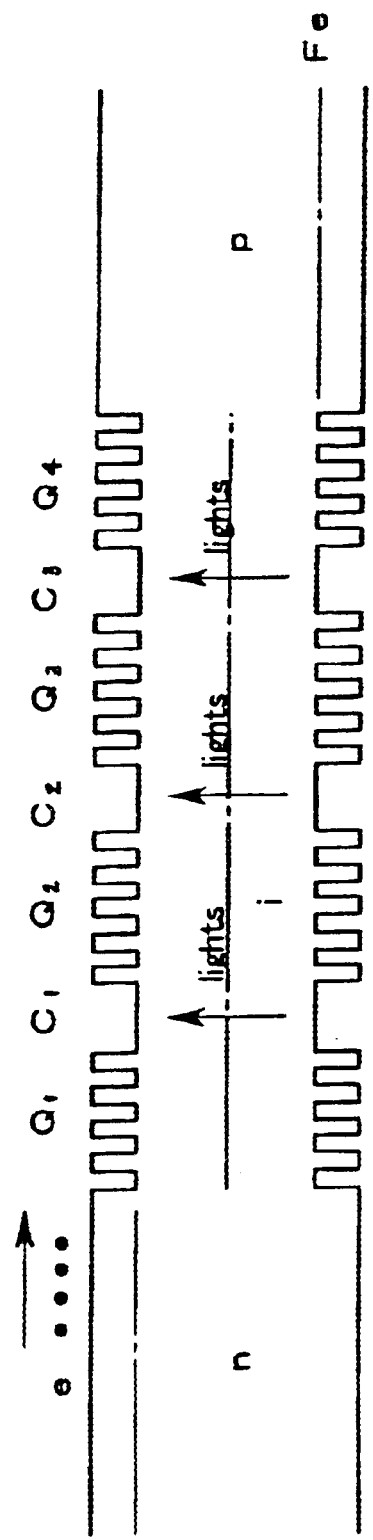
FIG. 1 is a view showing the energy diagram of a quantum-wave interference layer according to the present invention.
Figure 2:
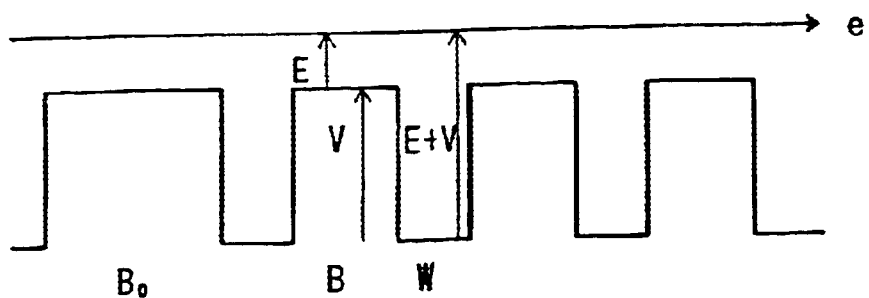
FIG. 2 is an explanatory view of a conduction band of a multi-layer structure of the present invention.
Figure 3:
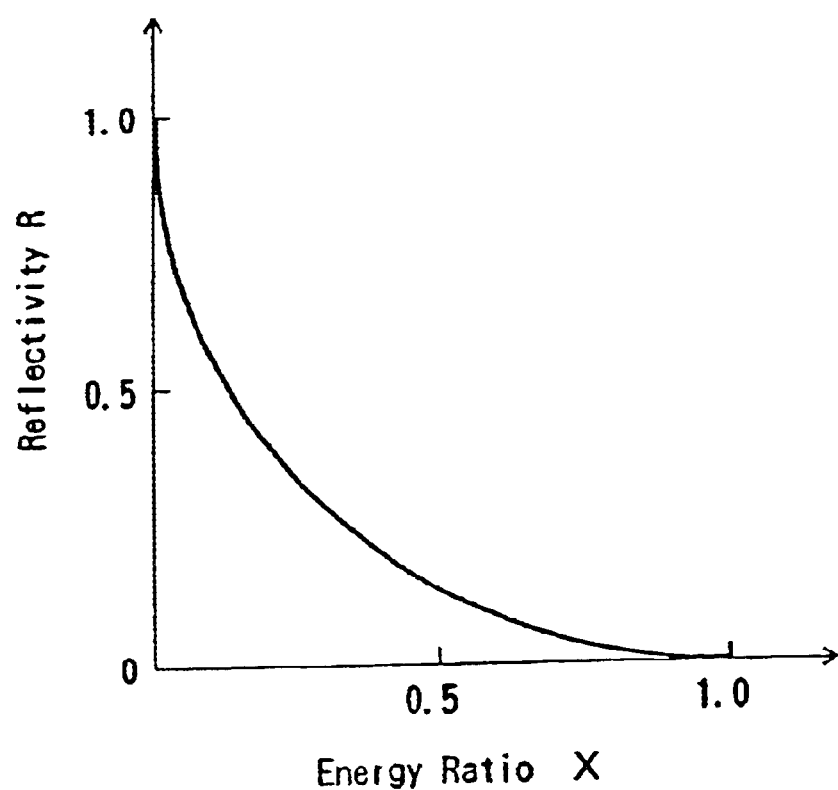
FIG. 3 is a graph showing a relation between an energy ratio x and a reflectivity R.
Figure 4E:
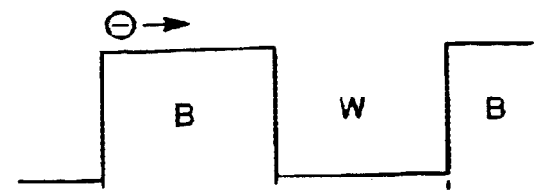
Figure 4F:
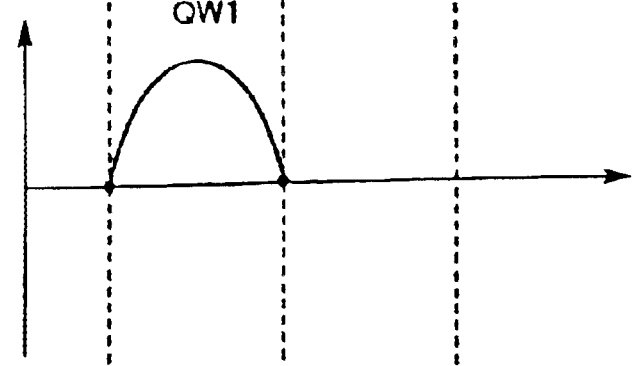
Figure 4G:
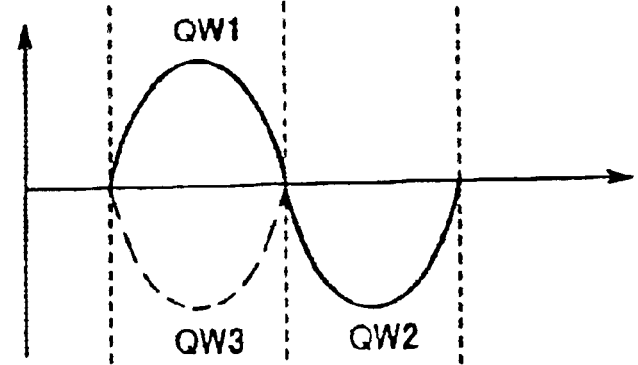
Figure 4H:
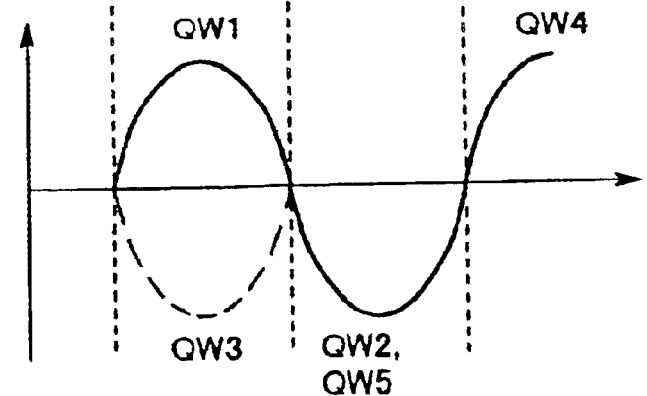
Figure 5:
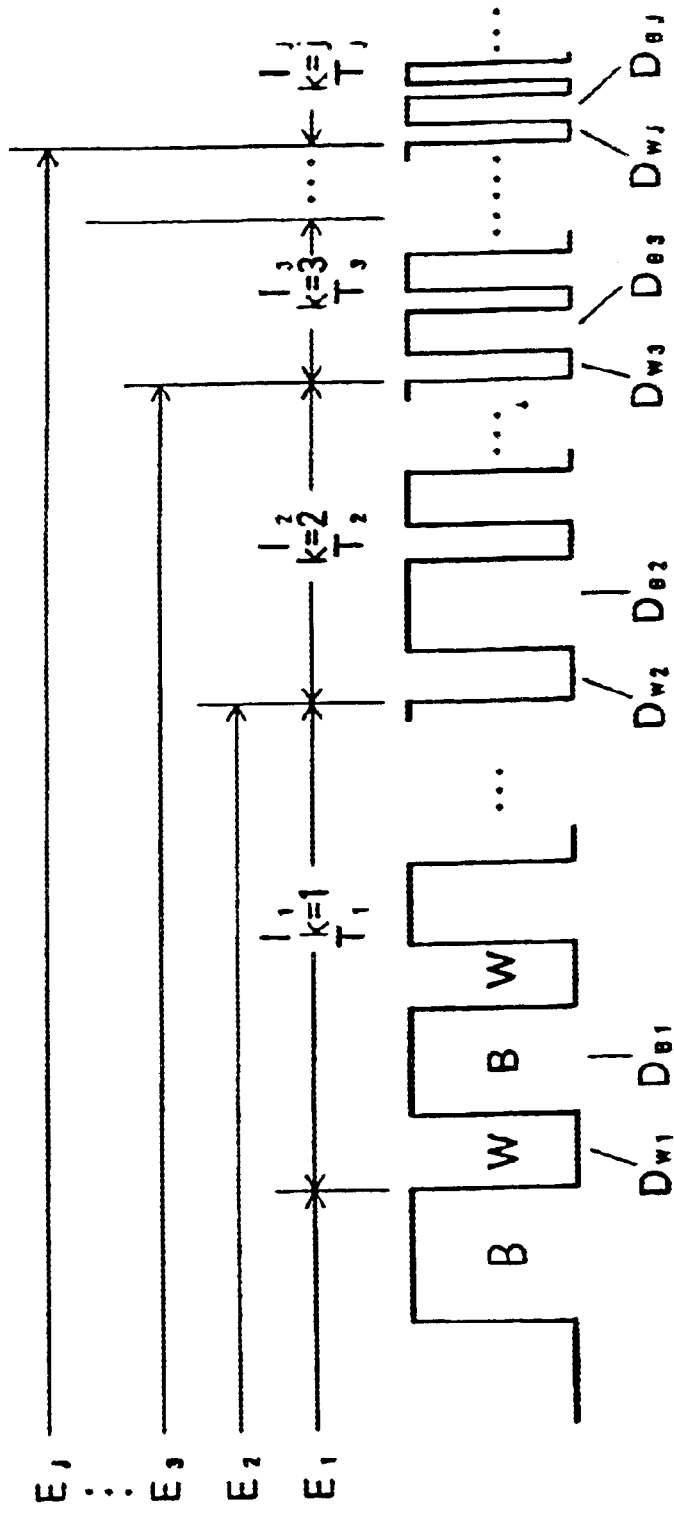
FIG. 5 is an explanatory view of partial quantum-wave interference layers $I_k$.

As shown in FIG. 1, as a forward voltage V applied between the p-layer 20 and the n-layer 16 of the light-receiving device 100 increases, an electric potential gradient occurring in the i-layer 18 becomes gentler until it becomes plane. In this condition, electrons do not flow because a transmission condition for electrons in all of quantum-wave interference layers $Q_1$ to $Q_4$ is not satisfied. That is, the electrons transmitted through the quantum-wave interference layer $Q_1$ are relaxed to a basic level in the carrier accumulation layer $C_1$ and the carrier in $C_1$ can not transmit through the quantum-wave interference layer $Q_2$.

When light having an energy resonant to bandwidth of carrier accumulation layers $C_1$ to $C_3$ is incided, electrons are excited in the carrier accumulation layers $C_1$ to $C_3$. An electron concentration in the carrier accumulation layers $C_1$ to $C_3$ becomes larger, and many electrons become to exist at the levels higher than the bottom of a conduction band in the second layer B. Then electrons in the n-layer 16 are conducted into the carrier accumulation layers $C_1$ which is adjacent to the n-layer 16, and electrons in the carrier accumulation layers $C_1$ are conducted into the carrier accumulation layers $C_2$. Accordingly, electrons intervene each carrier accumulation layers $C_1$ and are conducted to each carrier accumulation layers at a high speed, by wave propagation of electrons as a wave. Thus electrons are conducted from the n-layer 16 to the p-layer 20 by a light excitation at a high speed.

The light-receiving device 100 has a high opto-electric conversion effectivity because electrons, which are excited in the carrier accumulation layers $C_1$ to $C_3$, function as a gate-controlled switch toward the conduction of electrons from the n-layer 16 to the p-layer 20. When electrons are not excited in the carrier accumulation layers $C_1$ to $C_3$, a condition to transmit electrons is not satisfied in the quantum-wave interference layers $Q_1$ to $Q_4$. But when electrons are excited in the carrier accumulation layers $C_1$ to $C_3$, the condition is satisfied and electrons may be conducted in the quantum-wave interference layers $Q_1$ to $Q_4$ as a wave. Accordingly, a switching velocity is considered to be larger.

Figure 9:
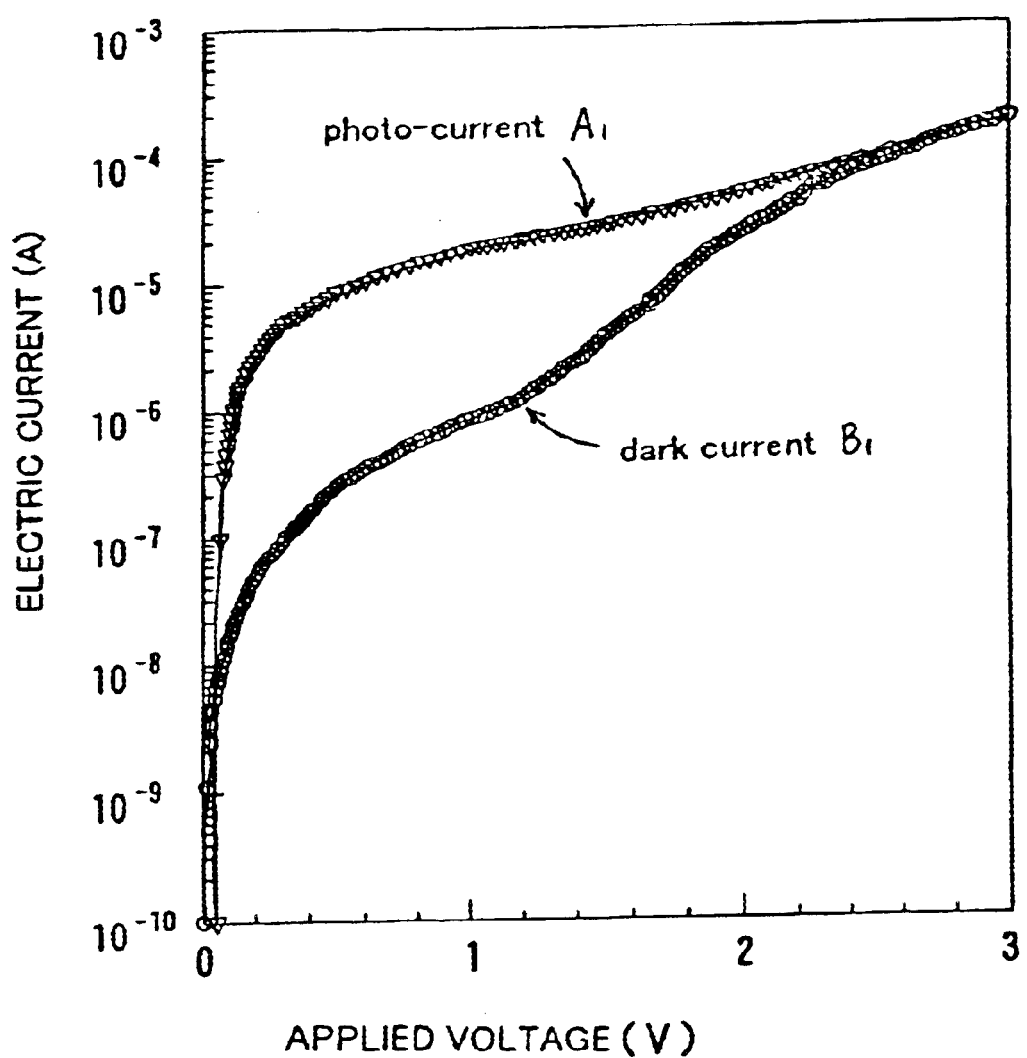
FIG. 9 is a graph showing measured V-I characteristic of the light-receiving device 100 when incided or not incided by light.

Measured V-I characteristic of the light-receiving device 100 is shown in FIG. 9. When light is incided, the photocurrent is $10^{-7}$ A at a slight forward voltage. And at 0.8 V of forward voltage, the photocurrent rises abruptly to $10^{-5}$ A. But even if a forward voltage is applied to the device, a dark current is suppressed at a lower value and degree of increasing is also suppressed. And the photocurrent when the diode is incided by light is about hundredfold that of a dark current, when the applied forward voltage is less than 1.2 V, and tenfold when the applied forward voltage is around 1.5 V. The photocurrent and the dark current are represented by A1 and B1, respectively. Additionally, the forward applied voltage at which an electric potential gradient in the i-layer 18 becomes plane is appeared to be 0.5 V. When an applied forward voltage is 0.5 V, the photocurrent is about $1\times10^{-5}$ A.

Comparative Example

As a comparative example, a light-receiving device 200 having the same structure as that of the light-receiving device 100 in Example 1 was manufactured. A quantum-wave interference unit $Q_1$ having a multi-quantum layer structure with 10 pairs of a $Ga_{0.51}In_{0.49}P$ first layer W, having a thickness of 5 nm, a $Al_{0.51}In_{0.49}P$ second layer B, having a thickness of 7 nm, and a non-doped $Al_{0.33}Ga_{0.33}In_{0.33}P$ δ layer, having a thickness of 1.3 nm, disposed between the first layer W and the second layer B is formed in the i-layer 18. $Q_2, \ldots Q_4$ are formed like $Q_1$, and 4 quantum-wave interference units in total are formed in the i-layer 18. FIG. 6A shows a band structure of the quantum-wave interference layer units $Q_1$ in detail. Non-doped $Ga_{0.51}In_{0.49}P$ carrier accumulation layers $C_1$ to $C_3$, each having a thickness of 20 nm, is formed between any quantum-wave interference units $Q_i$ and $Q_{i+1}$, respectively. Thicknesses of the first layer W and the second layer B are determined by substituting 1 into $n_W$ and $n_B$ in Eqs. 1 and 2, respectively, on condition that an external voltage is applied between the electrodes 28 and 26, and that no potential gradient is occurring in the i-layer 18. The quantum-wave interference layer functions as a carrier reflecting layer opposite to the carrier transmission layer. The present inventor has clarified the function and the structure of the carrier reflecting layer as shown in U.S. patent application Ser. No. 09/059,374. The second layers B which contact to the n-layer 16 and the p-layer 20 have thickness of 0.05 μm, respectively, to prevent electron from tunneling.

Figure 10:
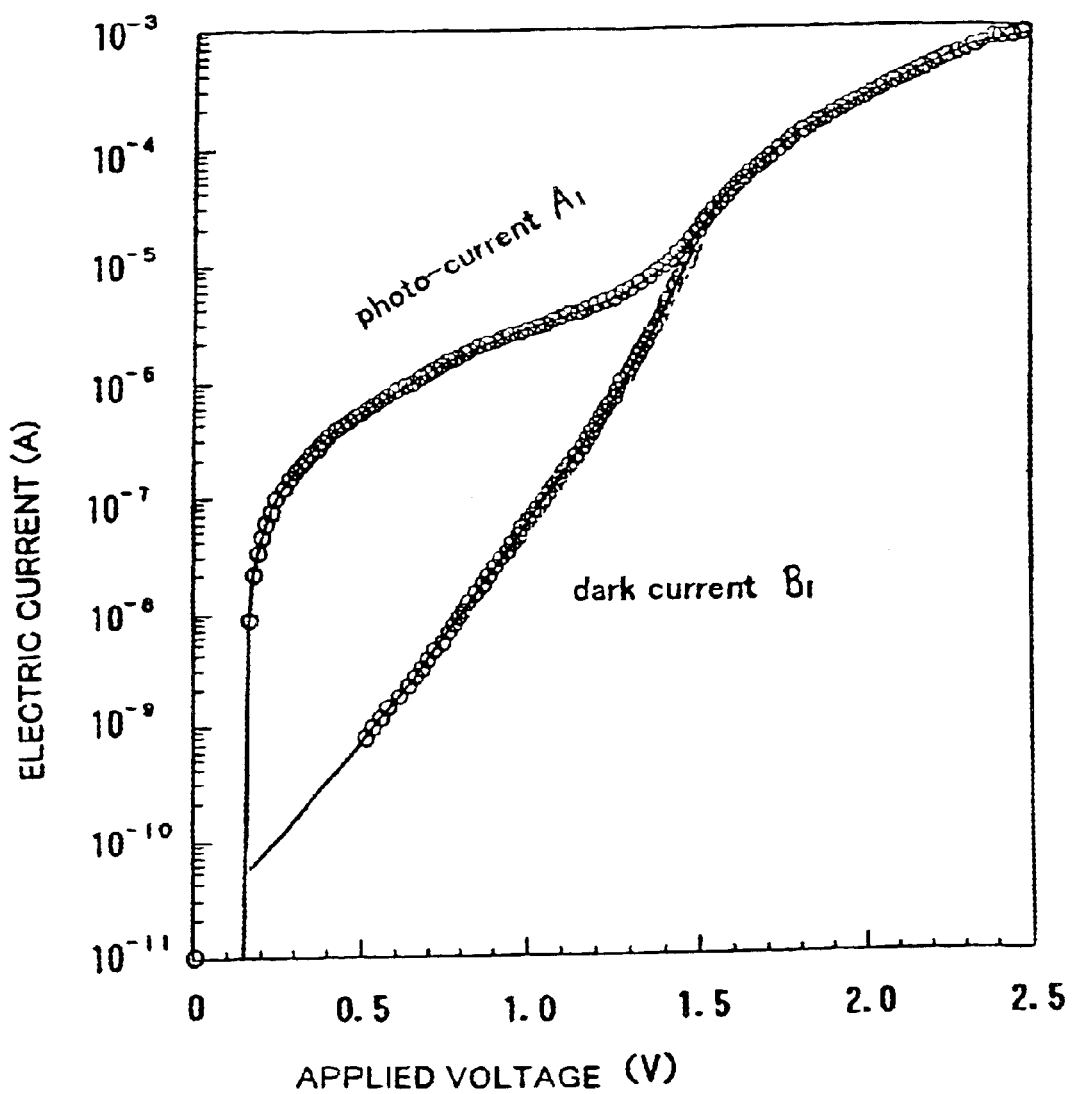
FIG. 10 is a graph showing measured V-I characteristic of the light-receiving device 200 when incided not incided by light (Comparative Example).

Measured I-V characteristic of the light-receiving device 200 is shown in FIG. 10. When light incided, the photocurrent rises abruptly from $10^{-11}$ A to $10^{-7}$ A, or in the range of 4 orders, at the forward voltage of 0.2 V. But the photocurrent of the light-receiving device 200, $10^{-7}$ A, is smaller compared with the photocurrent of the light-receiving device 100, $10^{-5}$ A, shown in FIG. 9. When an applied voltage is very small, electric current does not flow in the light-receiving device 200. On the contrary, electric current flows in the light-receiving device 100 in Example 1, by applying a small value of forward voltage.

Comparing with Example 1 and this comparative example, V-I characteristic difference between the photo-current and the dark current, and V-I characteristic difference between Example 1 and the comparative example are found to occur not because of a multi quantum-well structure itself but because of thicknesses of each layers in the multi quantum-well interference structure. Accordingly, a quantum-wave interference layer, functioning as a carrier transmitting layer which transmits carriers at a high velocity, can be obtained in the multi quantum-wave structure of the present invention.

In the embodiment, four quantum-wave interference layers $Q_1$ to $Q_4$ are connected in series, with each of the carrier confinement layers $C_1$ to $C_3$ lying between each of the quantum-wave interference layers. Alternatively, two quantum-wave interference layer units and one carrier accumulated layer therebetween can be formed in the i-layer at least.

In the embodiment, a δ layer is formed in the device 100. The δ layer enables to vary the band gap energy at a potential interface sharply and improves the quantum-wave interference effect (transmittivity) of the devices. Alternatively, although the quantum-wave interference effect declines, the δ layer is not necessarily needed.

Further, in the Example 1, the quantum-wave interference layer unit and the δ layer was made of ternary compounds including $Ga_{0.51}In_{0.49}P/Al_{0.51}In_{0.49}P$ and quaternary compounds including $Al_{0.33}Ga_{0.33}In_{0.33}P$, respectively. Alternatively, the quantum-wave interference layer units and a δ layer can be made of quaternary compounds such as $Al_xGa_yIn_{1-x-y}P$ or $Al_xGa_yIn_{1-x-y}As$, selecting arbitrary composition ratio within the range of $0 \leq x \leq 1$, $0 \leq y \leq 1$, and $0 \leq x+y \leq 1$.

As another alternative, the quantum-wave interference layer can be made of group III–V compound semiconductor, group II–VI compound semiconductors, Si and Ge, and semiconductors of other hetero-material. The desirable compositions are as follows. Each combinations is represented by a composition of a layer having a wide band width / a layer having a narrow band width // a substrate. And x and y are arbitrary values wherein $0 \leq x \leq 1$ and $0 \leq y \leq 1$, as long as they are not specified.

<1> $Al_xIn_{1-x}P/Ga_yIn_{1-y}P$ // GaAs
<2> $Al_xGa_{1-x}As$ / GaAs // GaAs
<3> $Ga_xIn_{1-x}P$ / InP // InP
<4> $Ga_xIn_{1-x}P$ / $Ga_xIn_{1-x}As$ // GaAs
<5> AlAs / $Al_xGa_{1-x}As$ // GaAs ($0.8 \leq x \leq 0.9$)
<6> InP / $Ga_xIn_{1-x}As_yP_{1-y}$ // GaAs
<7> Si / $SiGe_x$ // arbitrary material ($0.1 \leq x \leq 0.3$)
<8> Si / $SiGe_xC_y$ // arbitrary material ($0.1 \leq x \leq 0.3$, $0 < y \leq 0.1$)
<9> $Al_{x1}Ga_{y1}In_{1-x1-y1}N$ / $Al_{x2}Ga_{y2}In_{1-x2-y2}N$ // Si, SiC, GaN, or sapphire ($0 \leq x_1, x_2, y_1, y_2, x_1+y_1, x_2+y_2 \leq 1$)

While the invention has been described in connection with what are presently considered to be the most practical and preferred embodiments, it is to be understood that the invention is not to be limited to the disclosed embodiments, but on the contrary, the description is intended to cover various modifications and equivalent arrangements included within the spirit and scope of the appended claims. The present document claims the benefit of Japanese priority document, filed in Japan on Dec. 17, 1998, the entire contents of which is incorporated herein by reference.

Obviously, numerous modifications and variations of the present invention are possible in light of the above teachings. It is therefore to be understood that within the scope of the appended claims, the invention may be practiced otherwise than as specifically described herein.

What is claimed is:

1. A method of operating a light-receiving device which converts an incident light into an electric current, said light-receiving device comprising:

an n-layer with n conduction type;

a p-layer with p conduction type;

an intermediate layer;

quantum-wave interference layer units having plural periods of a pair of a first layer and a second layer, said second layer having a wider band gap than said first layer; and a carrier accumulation layer disposed between adjacent two of said quantum-wave interference layer units and electrons and holes being excited by incident light in said carrier accumulation layer; and wherein each thickness of said first and second layers is determined by multiplying by an even number one fourth of quantum-wave wavelength of carriers in each of said first and second layers and said carrier accumulation layer has a band gap narrower than that of said second layer, a kinetic energy of said carriers which determines said quantum-wave wavelength is set at a level near the bottom of a conduction band or a valence band of said second layer, according to the case that said carriers are electrons or holes, respectively, and a quantum-wave wavelength $\lambda_W$ in said first layer is determined by a formula $\lambda_W = h/[2m_W(E+V)]^{1/2}$, a quantum-wave wavelength $\lambda_B$ in said second layer is determined by a formula $\lambda_B = h/(2m_B E)^{1/2}$, said thickness of said first layer $D_W$ is determined by a formula $D_W = n_W \lambda_W/4$, and said second layer $D_B$ is determined by a formula $D_B = n_B \lambda_B/4$, where h, $m_W$, $m_B$, E, V, and $n_W$ and $n_B$ represent Plank's constant, effective mass of said carrier in said first layer, effective mass of said carrier in said second layer, kinetic energy of carriers flowing into said second layer, potential energy of said second layer to said first layer, and even numbers, respectively, wherein said method operating said light-receiving device comprises forward biasing said light-receiving device by applying a positive voltage to said p-layer such that carriers having said wavelength $\lambda_W$ are produced in said quantum-wave interference layer units.

2. A method of operating said light-receiving device according to claim 1, wherein said carrier accumulation layer has the same bandgap as that of said first layer.

3. A method of operating said light-receiving device according to claim 1, wherein said carrier accumulation layer is formed to have a thickness same as said quantum-wave wavelength $\lambda_W$.

4. A method of operating said light-receiving device according to claim 1, wherein a δ layer is formed between said first layer and said second layer, said δ layer is substantially thinner than said first layer and said second layer, and sharply varies an energy band.

5. A method of operating said light-receiving device according to claim 1, said light-receiving device further comprising:

a pin junction structure; and wherein said quantum-wave interference layer units and said carrier accumulation layer are formed in an i-layer.

6. A method of operating said light-receiving device according to claim 1, wherein said quantum-wave interference layer units and said carrier accumulation layer are formed in said n-layer or said p-layer.

7. A method of operating said light-receiving device according to claim 6, said light-receiving device further comprising a pn junction structure.

8. A method of operating said light-receiving device according to claim 1, said light-receiving device further comprising a pn junction structure.

9. A method of operating said light-receiving device according to claim 1, wherein excited electrons flow to said p-layer.

10. A method of operating said light-receiving device according to claim 1, wherein excited holes flow to said n-layer.

11. A method of operating said light-receiving device according to claim 1, wherein said quantum-wave interference layer units and said carrier accumulation layer are positioned in said intermediate layer.

* * * * *